United States Patent
Degrenne et al.

(10) Patent No.: US 11,169,201 B2
(45) Date of Patent: Nov. 9, 2021

(54) DIAGNOSTIC DEVICE AND METHOD TO ESTABLISH DEGRADATION STATE OF ELECTRICAL CONNECTION IN POWER SEMICONDUCTOR DEVICE

(71) Applicant: MITSUBISHI ELECTRIC CORPORATION, Tokyo (JP)

(72) Inventors: Nicolas Degrenne, Rennes (FR); Julio Cezar Brandelero, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 38 days.

(21) Appl. No.: 16/756,031

(22) PCT Filed: Oct. 30, 2018

(86) PCT No.: PCT/JP2018/040923
§ 371 (c)(1),
(2) Date: Apr. 14, 2020

(87) PCT Pub. No.: WO2019/107075
PCT Pub. Date: Jun. 6, 2019

(65) Prior Publication Data
US 2020/0256912 A1 Aug. 13, 2020

(30) Foreign Application Priority Data
Dec. 1, 2017 (EP) ..................... 17306688

(51) Int. Cl.
*G01R 31/27* (2006.01)
*G01R 31/26* (2020.01)
*G01R 31/327* (2006.01)

(52) U.S. Cl.
CPC ......... *G01R 31/27* (2013.01); *G01R 31/2608* (2013.01); *G01R 31/327* (2013.01)

(58) Field of Classification Search
None
See application file for complete search history.

(56) References Cited

U.S. PATENT DOCUMENTS 9,450,019 B2 * 9/2016 Kadow ............... H01L 29/7826
2011/0068818 A1 * 3/2011 Fukami .............. G01R 31/2642
324/762.01
(Continued)

FOREIGN PATENT DOCUMENTS

EP 3627162 A1 * 3/2020 ........... G01R 31/263

OTHER PUBLICATIONS

International Search Report (PCT/ISA/210) issued in PCT/JP2018/040923, dated Feb. 25, 2019.
(Continued)

*Primary Examiner* — Jermele M Hollington
(74) *Attorney, Agent, or Firm* — Birch, Stewart, Kolasch & Birch, LLP

(57) ABSTRACT

A method to establish a degradation state of electrical connections in a power semiconductor device comprising:
measuring at least two voltage drop values under two respective current values for the same temperature value. The two current values are strictly different or the measurements are made under two distinct gate levels of a transistor;
saving the measured values as calibration data;
monitoring operational conditions of said power semiconductor device;
measuring at least two voltage drop values under respective same current values as preceding, and at two respective moments during which the monitored operational conditions corresponding to two respective predefined sets of criteria related to states of operation and to a common temperature;
saving the at least two values as operational data;
(Continued)

calculating a numerical index in a manner to estimate a degradation state of said power semiconductor device.

15 Claims, 5 Drawing Sheets

(56) References Cited

U.S. PATENT DOCUMENTS

| | | | | |
|---|---|---|---|---|
| 2015/0032404 | A1* | 1/2015 | Bohllander | G01R 31/2619 |
| | | | | 702/107 |
| 2016/0116345 | A1* | 4/2016 | Furtner | G01K 7/01 |
| | | | | 374/178 |
| 2020/0075529 | A1* | 3/2020 | Otsuka | H01L 23/3735 |
| 2020/0408830 | A1* | 12/2020 | Degrenne | G01R 31/2812 |

OTHER PUBLICATIONS

Written Opinion of the International Searching Authority (PCT/ISA/237) issued in PCT/JP2018/040923, dated Feb. 25, 2019.

\* cited by examiner

DIAGNOSTIC DEVICE AND METHOD TO ESTABLISH DEGRADATION STATE OF ELECTRICAL CONNECTION IN POWER SEMICONDUCTOR DEVICE

TECHNICAL FIELD

The invention pertains to the technical field of the power semiconductor devices. More specifically, the invention is related to a method to evaluate the state of such a power semiconductor device and a diagnostic device arranged to implement such a method.

BACKGROUND ART

Usually, during operations of a power semiconductor device, wire-bonds and other interconnections (such as metallization and solders) are subject to thermo-mechanical stress, including high thermic changes and vibrations. The degradation of interconnections, wire-bonds and/or metallization manifests in the increase of the electrical resistance ($\Delta R$) in the current path. The electrical resistance is measurable as a growing of voltage drop. The said voltage drops can be gradual and/or abrupt in case of wire-bond failure. The voltage drop can be detected by measuring a voltage at an outside of the power electrical device or directly at the said interconnections. Thus, measuring the increase of such a voltage is useful for estimating the state of health of the wire-bonds and/or metallization.

However, such a voltage is strongly dependent on operational conditions, including the temperature. To distinguish/isolate the effect of operational conditions from the effect of the degradation on a measured voltage is difficult.

In addition, such power electrical devices are generally difficult to access in service, for example when sealed into a non-removable hermetic casing. A physical inspection of each device is economically not reasonable, especially when many devices equip an entire vehicle fleet in services, like trains, or windmills which are difficult to access. Generally, a theoretical period of lifetime is arbitrarily fixed for all the devices of a set. They are replaced only after an effective and unexpected failure or when the arbitrary period of lifetime is exceeded, regardless of the real state of the devices.

Some existing method to test the devices are planned to be implemented on a test-bench, in stable and/or controlled conditions. Such methods cannot be transposed on a power electrical device in operating service. This implies to interrupt the power electrical device operations to test it. This is not satisfactory.

Such problems are not sufficiently addressed in the prior art for on-line implementation.

SUMMARY OF INVENTION

The invention improves the situation.

The applicant proposes a method to establish a degradation state of electrical connections in a power semiconductor device. The method comprises:

a) measuring at least a first voltage drop value of said power semiconductor device when said power semiconductor device is in a first state, subjected to a first current value ($I_{on\_1}$) and to a first temperature value;

b) measuring at least a second voltage drop value of said power semiconductor device when said power semiconductor device is in a second state, subjected to a second current value and to a second temperature value, the second temperature value being equal to the first temperature value within plus or minus 5° C., at least one of the two following conditions being fulfilled:

the first current values being equal to a first threshold value and the second current value ($I_{on\_2}$) being equal to a second threshold value, the second threshold value being strictly superior to the first threshold value, the first state and the second state are different one from the other at least with respect to a gate level of a transistor, or of a set of transistors, of the power semiconductor device;

c) saving the at least two values as calibration data;

d) monitoring in operational conditions the current and at least one parameter representing a state of operation of said power semiconductor device;

e) measuring at least a third voltage drop value of said power semiconductor device under current equal to the first current value within plus or minus 5% of a nominal current of the power semiconductor device, and at a moment during which the at least one monitored parameter corresponds to a first predefined set of criteria related to a state of operation of said power semiconductor device and to a third temperature value of the power semiconductor device;

f) measuring at least a fourth voltage drop value of said power semiconductor device under current equal to the second current value within plus or minus 5% of the nominal current of the power semiconductor device, and at a moment during which the at least one monitored parameter corresponds to a second predefined set of criteria related to a state of operation of said power semiconductor device and to a fourth temperature value of the power semiconductor device equal to the third temperature value within plus or minus 5° C.;

g) saving the at least two values as operational data;

h) calculating a numerical index in function of the calibration data and the operational data in a manner to estimate a degradation state of said power semiconductor device (1).

Such a method enables to monitor a numerical health index, for example the electrical resistance increase $\Delta R$ to estimate the state of health and remaining life of a power semiconductor device. The results of such a method are independent from operating temperatures. Such a method can be implemented by using a single voltage sensor. Such a method is low-cost. Such a method does not require an off-line calibration. As a consequence, old power semiconductor devices can be equipped with a system according to the invention to implement the said method. The method is especially adapted to be implemented on power semiconductor devices including diodes, IGBTs and/or MOSFETs because of the high current used and the high influence of operational parameters, like the operating temperature, on the measured voltages.

In a second aspect of the invention, the applicant proposes a diagnostic device including at least one processor operatively associated with at least one storage medium, and a set of plugs able to be plugged to a power semiconductor device. The diagnostic device is arranged in order to implement a method according to the preceding when plugged to said power semiconductor device.

In another aspects of the invention, the applicant proposes a program product executable by a processor in the form of a software agent including at least one software module comprising instructions to implement a method according to the above, and a non-transitory computer-readable storage medium comprising a program product stored thereon and executable by a processor in the form of a software agent including at least one software module comprising instructions to implement a method according to the above.

The method and/or the device can comprise the following features, separately or in combination one with the others:

The power semiconductor device comprises an Insulated Gate Bipolar Transistor (IGBT), a Metal Oxide Semiconductor Field Effect Transistor (MOSFET), a diodes assembly, or a combination of such elements. The method gives particularly good results for such devices.

The measuring of the voltage drop values of said power semiconductor device are implemented continuously or at a predetermined frequency, and not only at a moment during which the at least one monitored parameter corresponds to a predefined state of operation of said power semiconductor device. This enables to ensure a continuous monitoring of the health evolution and to quickly detect any abnormal situation.

The second threshold value is superior or equal to twice the first threshold value. Measuring the voltage drops at two very different current values enables to construct more realistic models. The accuracy of the index calculation is increased.

The numerical index is calculated by extrapolation from the hypothesis that both the calibration data correspond to a situation wherein the numerical index has a value corresponding to a total absence of degradation of the electrical connections of said power semiconductor device. As a consequence, the calibration data measurements can be made at the beginning life of the device, while the operational data are measured later, in real operational conditions of the device.

The monitoring step includes the monitoring of at least a frequency of said current. Doing this enables to ensure that the temperature is substantially the same for the two voltage drop measurements, even when the temperature itself cannot be directly measured.

The first and second predefined set of criteria includes a frequency superior or equal to 20 Hz. And the measurements of the at least third and fourth voltage drop value are made in two respective instants of a common period of the current. This enables to ensure that the temperature is substantially the same for the two voltage drop measurements, even when the temperature itself cannot be directly measured, because of the thermic inertia of the device.

The monitored parameter corresponds to a state of the power semiconductor device with respect to a gate level of a transistor, or of a set of transistors, of said power semiconductor device, the first and second predefined set of criteria including a different criteria one with respect to the other about the state of the power semiconductor device with respect to said gate level. This enables to ensure that the two states of the device are different for the two voltage drop measurements. In addition, if the two measurements are made immediately before and after a change of the state with respect to the gate level, it is possible to be sure that the temperature is substantially the same for the two voltage drop measurements, even when the temperature itself cannot be directly measured.

In the method,
the measuring steps a) and b) of the said first and second voltage drop values are made in two respective instants mutually separated of at most 50 milliseconds; and/or
the measuring steps e) and f) of the said third and fourth voltage drop values are made in two respective instants mutually separated of at most 50 milliseconds. This enables to ensure that the temperature is substantially the same for the two voltage drop measurements, even when the temperature itself cannot be directly measured, because of the thermic inertia of the device.

In the method,
the measuring step of at least the first voltage drop value further includes measuring the first temperature value, and/or
the measuring step of at least the second voltage drop value further includes measuring the second temperature value;
the saving step further includes saving each said temperature value associated with the respective voltage drop value as calibration data, and
the calculating step of a numerical index further includes calculating a temperature in function of the calibration data and the respective operational data. In situations where the temperature can be directly measured, the construction of the models and/or the index calculation are more accurate.

The said at least one parameter representing a state of operation of said power semiconductor device monitored during the monitoring step is deprived of a measured temperature. And the operational data is deprived from measured temperature values to the step of calculating said numerical index. Other available parameters can be used, for example the current frequency and/or a state of the power semiconductor device with respect to a gate level. As a consequence, the method can be improved even if a temperature measurement is difficult or impossible during the operational life of the device.

The method further comprises a step of constructing a model of a relation between the at least two voltage drops in function of the current values when the numerical index is equal to zero, said model being then used to calculate said numerical index in function of the calibration data and the operational data. To construct such a model enables to avoid any direct measurement of the temperature. The method and the results are kept achievable even if a temperature measurement is difficult or impossible during the operational life of the device The method further includes the following step:
i) constructing a degradation model of said power semiconductor device by extrapolation of an evolution of the numerical index in such a way to estimate an end of life of the electronic device. Such supplementary step enables to facilitate the maintenance scheduling of the device, or of an entire fleet of analogous devices.

Other features, details and advantages will be shown in the following detailed description and on the figures.

DESCRIPTION OF EMBODIMENTS

Figure 1:
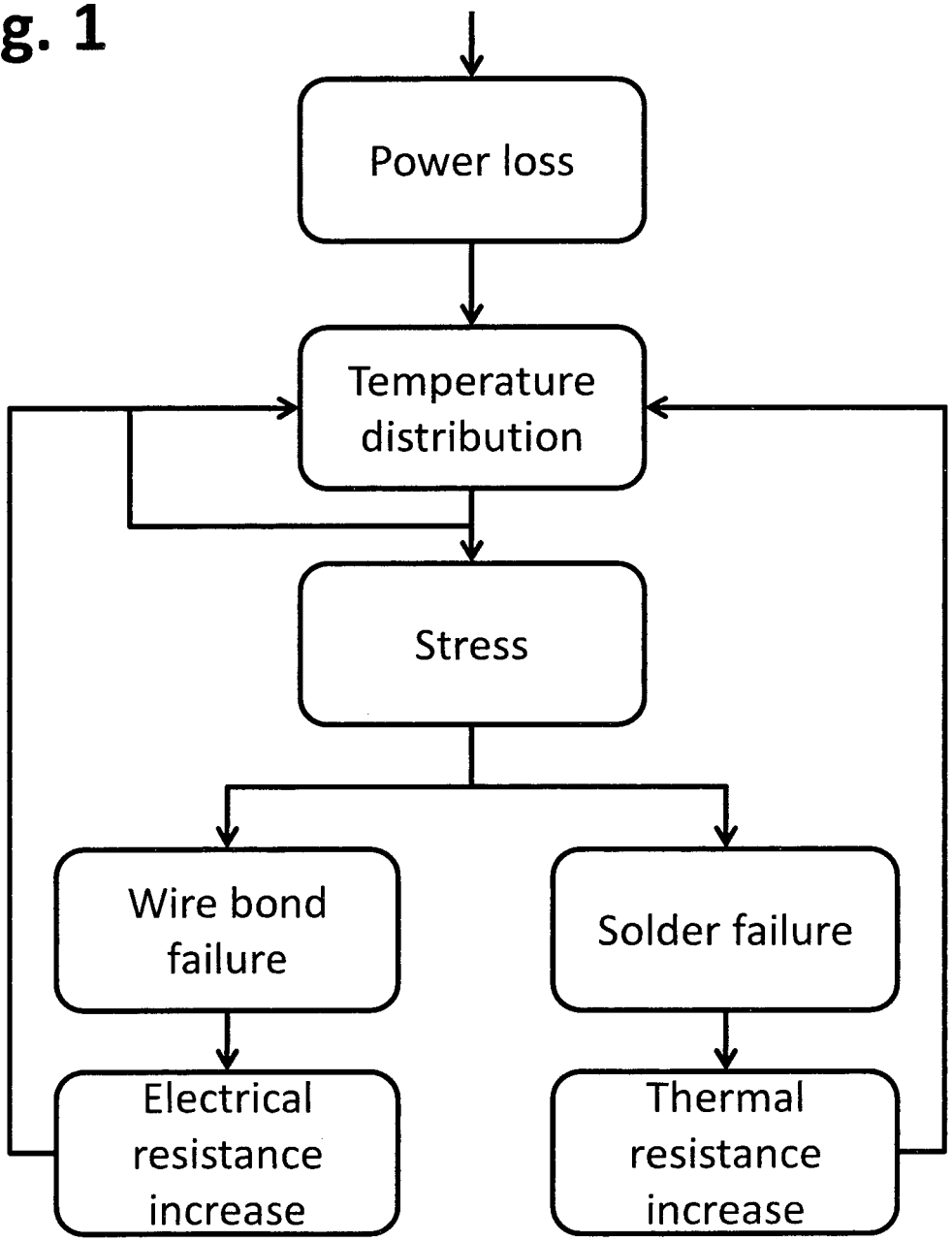
FIG. 1 is a logic diagram of interrelated technical effects in a power semiconductor device.

Figures and the following detailed description contain, essentially, some exact elements. They can be used to enhance understanding the invention and, also, to define the invention if necessary. It should be understood that some details of the three dimension structure of the device are difficult to describe exhaustively other than by figures.

In the following, the words "[two values] substantially equals" have to be interpreted according to the technical context. For two currents values, the margin of error depends on the device and its power environment. For example, "[two current values] substantially equals" can be understood as two current values equal within plus or minus 5%, 4%, 3%, 2% or 1% of a reference current, or of a nominal current $I_{nom}$, of the power semiconductor device in service. For two temperature values, the margin of error depends on the desired accuracy of the measurements. For example, "[two temperature values] substantially equals" can be understood as two temperature values equal within plus or minus 5° C., 4° C., 3° C., 2° C. or 1° C.

The method described hereinafter addresses the topic of condition and health monitoring of power semiconductor devices for the purpose of state of health and/or remaining useful life estimation, especially for power semiconductor devices. For example, the method can be implemented on devices comprising an Insulated Gate Bipolar Transistor (IGBT), a Metal Oxide Semiconductor Field Effect Transistor (MOSFET), a diode, or a combination of such elements. As non-limiting examples, the following module commercialized by the applicant has been used: "CM150TX-2451— High power switching use insulated type". The technical notice including detailed features of this module is freely and publicly accessible.

In the following, the "voltage drop value", referenced $V_{on}$, corresponds to an "on-state voltage drop" (equivalent to a collector-emitter voltage $V_{ce}$ for IGBTs, an anode-to-cathode voltage $V_{ak}$ for diodes, a drain-source voltage $V_{ds}$ for MOSFETs in forward mode, or a drain-source voltage $V_{sd}$ for MOSFETs in reverse mode) or a "wire-bond voltage drop" (between the Kelvin to power emitter $V_{ke}$ for IGBTs and between the Kelvin to power source $V_{ks}$) depending of the nature of the electronic members tested in the power switching device/module (Diodes assemblies, MOSFETs and/or IGBTs). The "voltage drop" has to be understood as the difference between a voltage measure at a predefined input $V_{in}$ of the power semiconductor device and a voltage measure at a predefined output $V_{out}$ of the power semiconductor device. In this context, the input and the output are not necessarily the general inputs and outputs of the entire power semiconductor device, but can be intermediate inputs/outputs of electronic members comprised in the power semiconductor device. Preferably, the general inputs and outputs of the device are used, especially when the power semiconductor device is a packaged device. For each embodiment, the input and the output are the same for each part of the method such that any difference between the measured values cannot be due to the location of the measures. In the following, the "voltage drop" is referenced "$V_{on}$" and has to be understood as the difference between $V_{out}$ and $V_{in}$ ($V_{on}=V_{out}-V_{in}$).

FIG. 1 is a positive feedback loop related to wire-bond failure and solder failure in a power semiconductor device.

According to FIG. 1, wire bond failures can be detected by monitoring the electrical resistance evolution ΔR during the operation of a converter. The electrical resistance evolution ΔR can be monitored by monitoring the voltage drop $V_{on}$. Nevertheless, the voltage drop $V_{on}$ depends not only on the bond failure but also depend on other parameters such as the temperature $T_j$ and current $I_{on}$. As a consequence, to know the voltage drop $V_{on}$ does not allow to directly deduce precise electrical resistance and therefore precise wire-bond degradation and relevant health information about the power semiconductor device.

Figure 10:
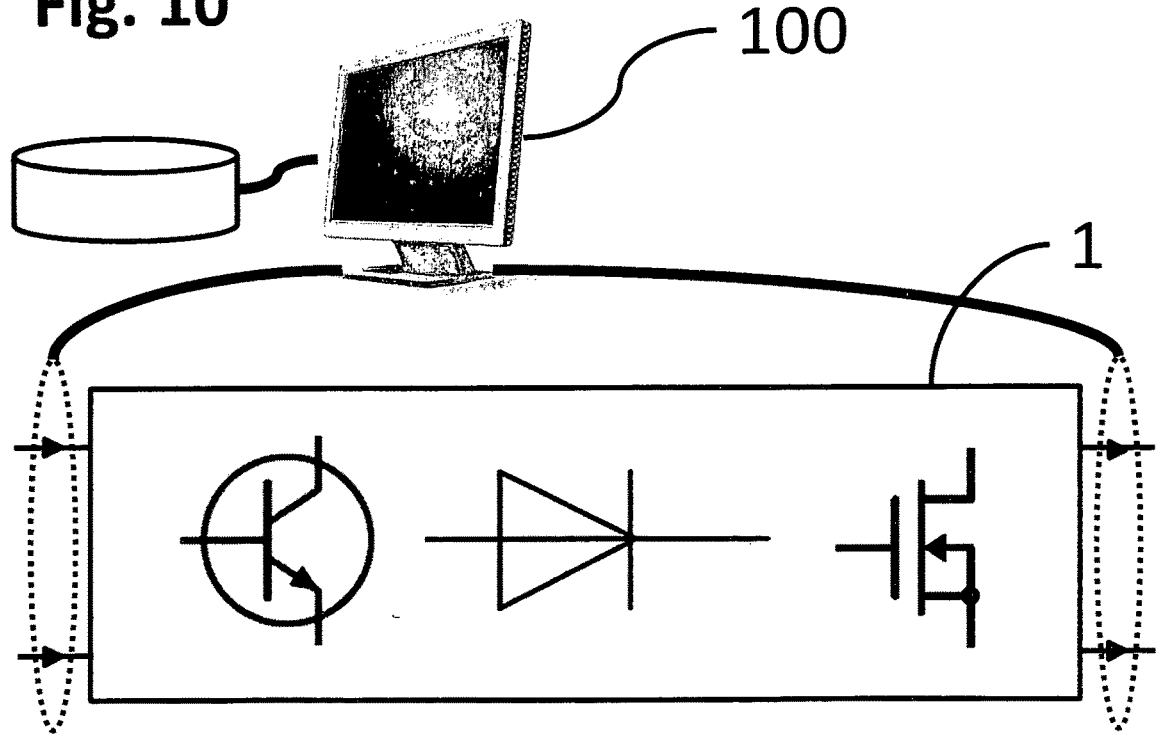
FIG. 10 shows a system according to the invention.

A method to establish a degradation state of electrical connections in a power semiconductor device 1 will be described hereinafter. Such a method can be implemented by using a diagnostic device 100 as represented on FIG. 10. The diagnostics device 100 includes at least one processor operatively associated with at least one storage medium, and a set of plugs able to be plugged to the inputs and outputs of power semiconductor device 1 to monitor it. The diagnostic device 100 is arranged in order to implement the method described hereinafter when it is plugged to the inputs and outputs of a power semiconductor device 1.

The method comprises the following steps:
a) measuring at least a first voltage drop value ($V_{on\_1\_calibration}$) of the power semiconductor device when the power semiconductor device is in a first state, subjected to a first current value ($I_{on\_1}$) and to a first temperature value ($T_{1\_calibration}$);
b) measuring at least a second voltage drop value ($V_{on\_2\_calibration}$) of the power semiconductor device when the power semiconductor device is in a second state, subjected to a second current value ($I_{on\_2}$) and to a second temperature value ($T_{2\_calibration}$), the second temperature value ($T_{2\_calibration}$) being substantially equal to the first temperature value ($T_{1\_calibration}$), at least one of the two following conditions being fulfilled:
  the first current values ($I_{on\_1}$) being equal to a first threshold value (X %×$I_{nom}$) and the second current value ($I_{on\_2}$) being equal to a second threshold value (Y %×$I_{nom}$), the second threshold value (Y %×$I_{nom}$) being strictly superior to the first threshold value (X %×$I_{nom}$),
  the first state and the second state are different one from the other at least with respect to a gate level of a transistor, or of a set of transistors, of the power semiconductor device;
c) saving the at least two values ($V_{on\_1\_calibration}$, $V_{on\_2\_calibration}$) as calibration data;
d) monitoring in operational conditions the current (I) and at least one parameter (T, $F_{mod}$, G) representing a state of operation of the power semiconductor device;
e) measuring at least a third voltage drop value ($V_{on\_1\_test}$) of the power semiconductor device
  under current ($I_{1\_test}$) substantially equal to the first current value ($I_{on\_1}$), and
  at a moment during which the at least one monitored parameter (T, $F_{mod}$, G) corresponds to a first predefined set of criteria related to a state of operation of the power semiconductor device and to a third temperature value ($T_{1\_test}$) of the power semiconductor device;
f) measuring at least a fourth voltage drop value ($V_{on\_2\_test}$) of the power semiconductor device
  under current ($I_{2\_test}$) equal to the second current value ($I_{on\_2}$), and
  at a moment during which the at least one monitored parameter (T, $F_{mod}$, G) corresponds to a second predefined set of criteria related to a state of operation of the power semiconductor device and to a fourth temperature value ($T_{2\_test}$) of the power semiconductor device (1) substantially equal to the third temperature value ($T_{1\_test}$);

g) saving the at least two values ($V_{on\_1\_test}$, $V_{on\_2\_test}$) as operational data;

h) calculating a numerical index ($\Delta R$) in function of the calibration data ($V_{on\_1\_calibration}$, $V_{on\_2\_calibration}$) and the operational data ($V_{on\_1\_test}$; $V_{on\_2\_test}$) in a manner to estimate a degradation state of the power semiconductor device.

Optionally, the method further comprises the following step:

i) constructing a degradation model of said power semiconductor device 1 by extrapolation of an evolution of the numerical index ($\Delta R$) in such a way to estimate an end of life of the electronic device.

The steps a) to c) can be viewed as a calibration phase of the method applied to the power semiconductor device 1, while steps e) to h) can be view as an active phase of the diagnostic. Steps a) to c) can be enforced a single time for each power semiconductor device 1, for example at the beginning of the operational life of the power semiconductor device 1 or even before its operational life on a test-bench.

After the calibration data is saved step c), steps d) to h) can be enforced continuously or repeatedly without need to repeat steps a) to c). For example, step d) of monitoring can be enforced continuously during the entire life of the power semiconductor device 1. In such a case, the measuring steps e) and f) can be enforced continuously or repeatedly, not only during the moments when the predefined state of operation of the power semiconductor device 1 is detected. In such a case, the step g) of saving the relevant values as operational data can be view as a step including a selection among the entire available measured data to record only the relevant data as operational data. The measuring of steps a) and b) can also be enforced continuously or repeatedly. In such a case, the step c) of saving the relevant values as calibration data can be view as a step including a selection among the entire available measured data to record only the relevant data as calibration data.

The saving step c) of the calibration data can be viewed as a selection of at least two voltage drop values corresponding to two distinct functioning modes of the power semiconductor device 1 while the temperatures are approximately the same. The saving step g) of the operational data can be viewed as a selection of the best moment(s) to acquire data during an operational functioning of the power semiconductor device 1, said operational conditions corresponding as much as possible to the conditions during which the calibration data have been measured.

The steps a) and b) enable to obtain at least two values: for example $V_{on\_1\_calibration}$ at $I_{on\_1}$, and $V_{on\_2\_calibration}$ at $I_{on\_2}$. In some examples, $I_{on\_1}$ is a low current, while $I_{on\_2}$ is a high current. "Low" and "high", in the context, have to be understood as corresponding to two distinct functioning modes of the power semiconductor device 1. A plurality of criteria can be chosen to ensure having two distinct functioning modes:

the first current values $I_{on\_1}$ is equal to a first threshold value and the second current value $I_{on\_2}$ is equal to a second threshold value. The second threshold value is strictly superior to the first threshold value ($I_{on\_2} > I_{on\_1}$).

in a more precise embodiment, the first threshold value is equal to X % of a reference current, for example a nominal current value $I_{nom}$, and the second threshold value is equal to Y % of the said reference, where Y is strictly greater than X (Y>X). For example, X=20% and Y=80%, or X=30% and Y=60%, or X=20% and Y=60%.

the second current values $I_{on\_2}$ is superior or equal to twice the first current values ($I_{on\_2}/I_{on\_1} \geq 2$).

A person skilled in the art would know how to adapt the criteria about the threshold currents in function of the application to correspond to two distinct functioning modes of the power semiconductor device 1. It is preferred to have two current values as different as possible.

In other examples, the calibration data are obtained at two different states at least with respect to a gate level G of a transistor, or of a set of transistors, of the power semiconductor device 1. In such examples, the current values $I_{on\_1}$ and $I_{on\_2}$ to which the calibration data $V_{on\_1\_calibration}$ and $V_{on\_2\_calibration}$ are acquired can be equal or different one from the other. For example, the passing/blocking state (or behavior) of an electronical element can be easily defined with respect to a gate level G. In other words, the at least two calibration data $V_{on\_1\_calibration}$ and $V_{on\_2\_calibration}$ can be obtained when a control current of an element of the power semiconductor device 1 is respectively superior and inferior to a gate level G.

The calibration values can be obtained before the power semiconductor device 1 being operational, for example during conformity tests after the manufacturing. In such a case, the power semiconductor device 1 can be voluntarily submitted, at the input, to two distinct chosen values of current $I_{on\_1}$ and $I_{on\_2}$.

The voltage drop values $V_{on\_1\_calibration}$, respectively $V_{on\_2\_calibration}$, are determined by measuring $V_{in}$ and $V_{out}$. The measuring of a pair of voltage drop values $V_{on\_1\_calibration}$, $V_{on\_2\_calibration}$ can be repeated. In such as case, a plurality of pairs of voltage drop values $V_{on\_1\_calibration\_i}$, $V_{on\_2\_calibration\_i}$ are obtained, where "i" is an iterative index. If a plurality of pairs are measured, the measuring are preferably made at high frequency $F_{mod}$ but at different other operating conditions, for example different heat-sink (or case) temperature, different load current $I_{load}$ (but still, $I_{load} \geq \max(I_{on\_1}, I_{on\_2})$), different switching frequency, and/or different modulation frequency. The temperature is preferably as constant as possible between the two voltage drop values $V_{on\_1\_calibration\_i}$, $V_{on\_2\_calibration\_i}$ of the same pair, but the temperature is preferably as different as possible between two pairs $V_{on\_1\_calibration\_i}$, $V_{on\_2\_calibration\_i}$; $V_{on\_1\_calibration\_j}$, $V_{on\_2\_calibration\_j}$, with $i \neq j$.

The test phase (steps d) to h)) can be made a long time after the calibration phase (steps a) to c)), with different equipment, and/or by different persons. In other words, the two phases can be viewed as two distinct methods. In such a case, the calibration data can be provided from another source to implement the test phase.

In another embodiment of the method, the steps a) and/or b) can be implemented when the power semiconductor device 1 is operational, for example as soon as the power semiconductor device 1 is on-line.

In an embodiment of the method requiring a small amount of calibration data, only two values can be measured. In the following, the relation between the two voltage drop values $V_{on\_1\_calibration}$, $V_{on\_2\_calibration}$ has the form of a curve. The curve $V_{on\_2} = f(V_{on\_1}, \Delta R = 0)$ is performed using these two values. If a plurality of pairs have been measured at different temperature, it is possible to construct as much curves as the measured pairs. In the examples corresponding to calibration data obtained at high and low current, a theoretical relation can be obtained between the voltage drop $V_{on\_1\_calibration}$ at low current $I_{on\_1}$ and the voltage drop $V_{on\_2\_calibration}$ at high current $I_{on\_2}$.

In a preferred embodiment of the method permitting precise, easy and quick establishment of the calibration, several points are measured and filtered to establish the curve $V_{on\_2}=f(V_{on\_1}, \Delta R\text{-}0,$ variable T). For example, the number of measurements and the period during which measurements are performed can be a fixed duration time or a duration time sufficiently long to obtain sufficient data. More there are measurements, more the said relation is precisely defined in such a manner to characterizing the nominal operation of the power semiconductor device 1.

Then, the measured values are registered (step c)). It can consist in saving directly the pairs of measured values. In other embodiments, the measured values can be treated/ analyzed before to be saved. Thus the calibration curve $V_{on\_2}=f(V_{on\_1}, \Delta R=0,$ variable T) resulting from the treatment/analysis is saved, thus saving calibration data memory.

In some embodiments, the measuring steps a) and/or b) further include measuring or deducing temperatures, respectively $T_{1\_calibration}$ and $T_{2\_calibration}$ to check that the temperatures are effectively substantially equals. ($T_{1\_calibration} \approx T_{2\_calibration}$). Preferably, $T_{1\_calibration}$ is measured because it is easier to measure temperature at low current. In such cases, the temperatures values $T_{1\_calibration}$ and/or $T_{2\_calibration}$ are saved as a part of the calibration data. In other words, the calibration data can have for example the following forms:

- $V_{on\_1\_calibration\_i}$ (one or several measured values), $I_{on\_1}$ (one pre-defined value); $V_{on\_2\_calibration\_i}$ (one or several measured values), $I_{on\_2}$ (one pre-defined value);
- $V_{on\_1\_calibration}, I_{on\_1}, T_{1\_calibration}; V_{on\_2\_calibration}, I_{on\_2}, T_{2\_calibration}$;
- model $V_{on\_2\_calibration}=f(V_{on\_1\_calibration}, \Delta R=0,$ T variable)
- model $V_{on\_2\_calibration}=f(V_{on\_1\_calibration}, \Delta R=0,$ T variable) and model $V_{on\_1\_calibration}=f(T, \Delta R=0)$ As a consequence, the calculating step of a numerical index (step h)) includes a calculation of an electrical resistance $\Delta R$, and can optionally include a calculation of a temperature T as it will be described in the following.

Initially, when the power semiconductor device 1 is new (not used), the connections and wire-bonds can be considered as intact. The electrical resistance of connections can be defined as a reference and virtually set as $\Delta R=0$. It is possible to establish a theoretical relation between the voltage drop $V_{on\_1\_calibration}$ at a low current $I_{on\_1}$ and the voltage drop $V_{on\_2\_calibration}$ at a high current $I_{on\_2}$, for example in the following form: $V_{on\_2\_calibration}=f(V_{on\_1\_calibration})$. Such a relation for any $\Delta R \geq 0$ can be obtained by solving the following simple analytical equations:

$$V_{on\_2\_calibration}=V_{on\_2\_calibration}(\Delta R=0, T \text{ variable}) + \Delta R \times I_{on\_2}$$

$$V_{on\_1\_calibration}=V_{on\_1\_calibration}(\Delta R=0, T \text{ variable}) + \Delta R \times I_{on\_1},$$

Figure 4:
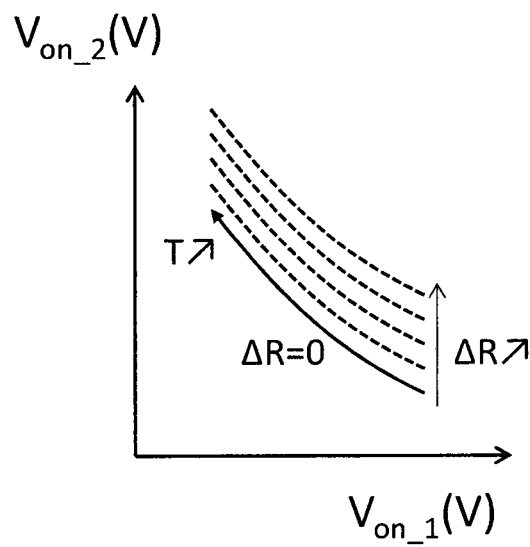
FIG. 4 shows a behavior of an IGBT.
Figure 5:
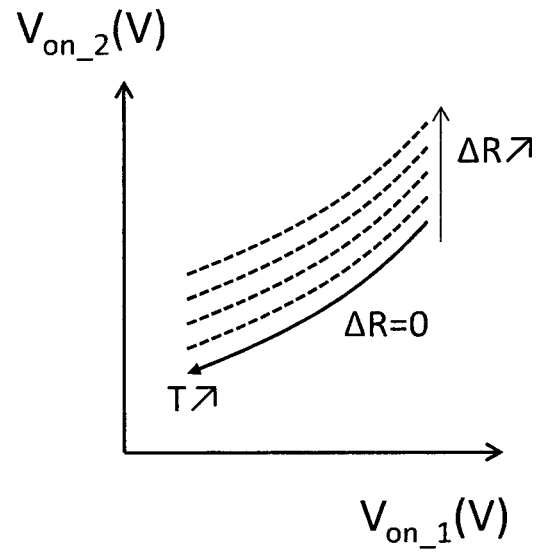
FIG. 5 shows a behavior of a diode.

Then, it is possible to establish the following relation: $\Delta R = f(V_{on\_1}, V_{on\_2})$ These relations can have the form of curves (see for example FIGS. 4 and 5). The calibration stage allows determining this relation either in the form of a look-up table or as an analytical (physical or empirical) equation (dashed lines on FIGS. 4-7). FIG. 4 shows, for example, the voltage drop $V_{on\_1}$ respectively under a low current $I_{on\_1}$ and $V_{on\_2}$ under a high current $I_{on\_2}$ of an IGBT. FIG. 5 shows the same for a diodes assembly.

The measured values forming the calibration data can be saved (step c)) directly and/or in the form of the established relations.

Figure 2:
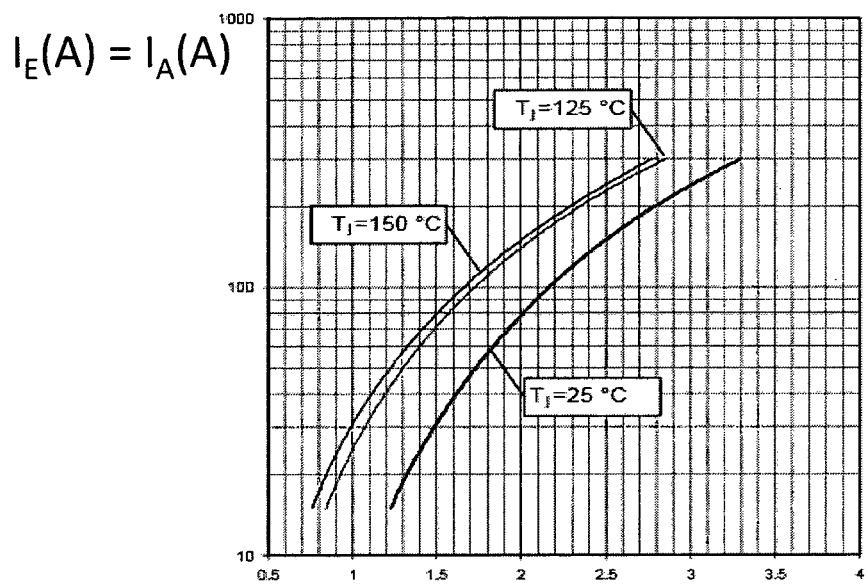
FIG. 2 is a diagram showing an emitter current in function of an emitter-collector voltage of a diode placed anti-parallel to an IGBT.
Figure 3:
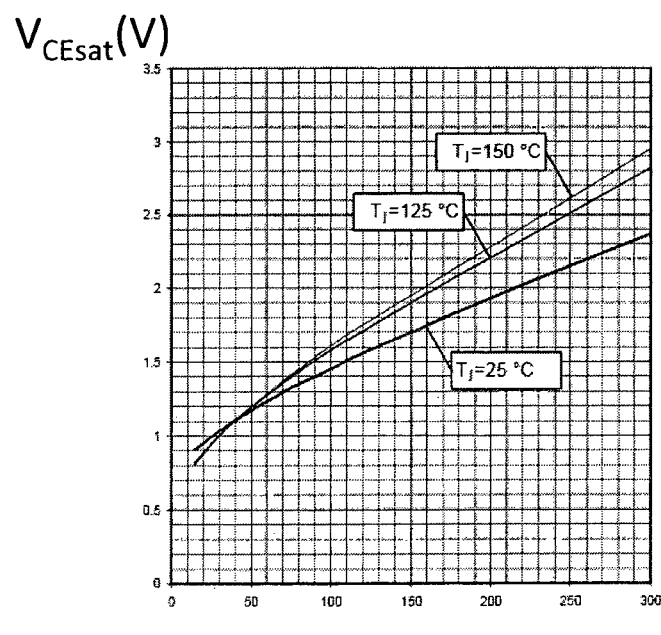
FIG. 3 is a diagram showing a collector-emitter saturation voltage in function of a collector current of an IGBT.

The on-state voltage of diodes, IGBTs and MOSFETs, and the voltage drop across wire-bond connections are typically dependent on the current I and temperature T. In case of wire-bond degradation, the electrical resistance increase also leads to an increase of the total voltage drop $V_{on}$. FIG. 2 (diodes assembly) and FIG. 3 (IGBT) are example of characterizing behavior of power semiconductor devices. FIG. 2 shows, for example, the anode current $I_A$ (ampere) in function of the anode-cathode saturation voltage $V_{AC}$ (volt) for a plurality of temperatures $T_j$, for a diode in an IGBT power module. In the example, FIG. 2 shows a Negative Temperature Coefficient (NTC) behavior of a diode arrangement in the device referenced "CM150TX-24S1" of the applicant. FIG. 3 shows, for example, the collector-emitter saturation voltage $V_{ECsat}$ (volt) in function of the collector current $I_C$ (ampere) for a plurality of temperatures $T_j$, the gate-emitter voltage $V_{GE}$ being fixed to 15 volts. In the example, FIG. 3 shows a Negative Temperature Coefficient (NTC) for current $I_c$ below 40 A ("low current") and a Positive Temperature Coefficient (PTC) for current $I_c$ above 40 A ("high current"). This corresponds to a behavior of an IGBT in the device referenced "CM150TX-24S1" of the applicant.

Because the increase of electrical resistance of the wire-bonds, referenced $R_{wb}$, this may create a local elevation in the temperature of the wire-bonds, referenced $T_{wb}$. The net resistivity of the material of the wire-bonds (for example aluminum) may slightly increase and lead to the observation of an apparent higher resistance increase. Such a self-amplifying effect of electrical resistance increasing $\Delta R$ can generally be neglected as it is relatively well localized, not distributed to the entire device. The following relation can be formulated:

$$V_{on\_measured}=(R_{wb}(T_{wb})+\Delta R) \times I_{on} + V_{on\_DIE}(T_j, I_{on})$$

Depending on the power semiconductor device 1, the on-state current $I_{on}$ may be:
- the collector (or emitter) current for IGBTs,
- the anode (or cathode) current for diodes assemblies, or
- the drain (or source) current for MOSFETs.

The measured data can be obtained from a sensor, for example Hall Effect sensors or shunt sensors. The measured data can be obtained from a controller of the power semiconductor device, for example a reference current of the controller. In some existing power semiconductor devices, a sensor is present in the converter for control purposes. The measured data can be deduced/estimated from available data, optionally by improving a processing, for example by applying a gain or an offset removal.

Figure 6:
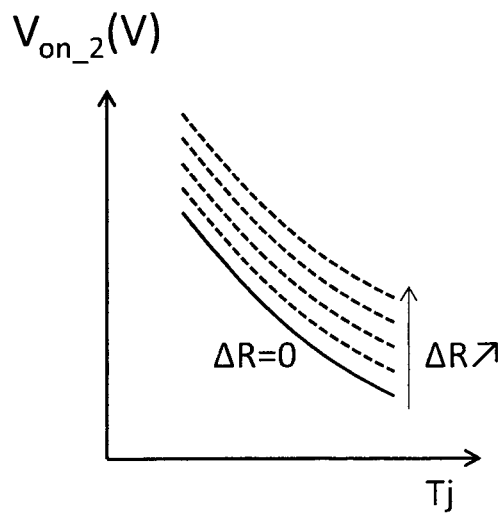
FIG. 6 shows a behavior of a diode.
Figure 7:
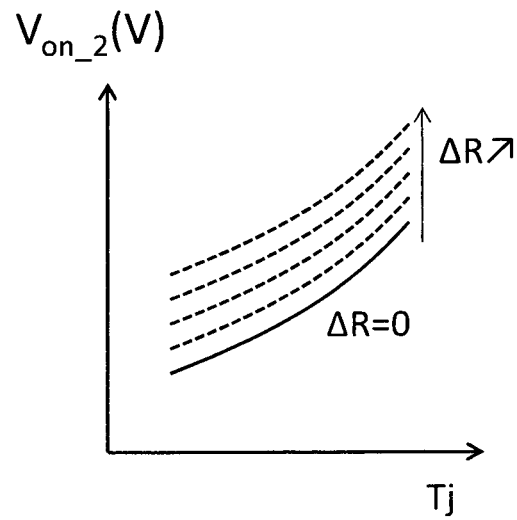
FIG. 7 shows a behavior of an IGBT.
Figure 8:
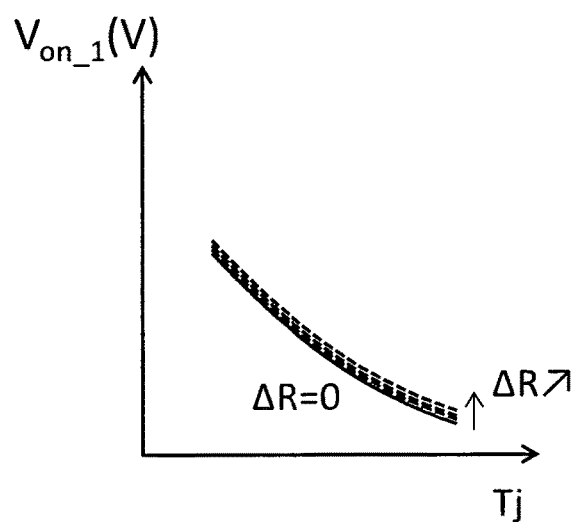
FIG. 8 shows a behavior of a diode or an IGBT.

If the calibration data comprises temperature data or data to correlate the voltage drop $V_{on\_1\_calibration}$ with the temperature T for $\Delta R=0$, the temperature T can be estimated as well. In absence of a specific sensor for the temperature, such a calibration is difficult to implement on-line. In absence of a specific sensor, such a calibration could be performed off-line, prior to the power semiconductor device assembly. The electrical resistivity $\Delta R$ can be estimated from time to time. This is made preferably when the modulating frequency $F_{mod}$ is high (for IGBTs and diodes assemblies). In this situation, the temperature T can be considered as a constant during a quarter of a period of an alternate current (AC) ($T_{mod}/4$) because of the thermic inertia. FIGS. 6, 7 and 8 show examples of correlation data in the form of curves between the temperature T and the voltage drop $V_{on}$. FIGS. 6 and 7 show, for example, the voltage drop $V_{on}$ under a high current $I_{on\_2}$ respectively of a diode assembly and of an IGBT. FIG. 8 shows, for example, the voltage drop $V_{on}$ under a low current $I_{on\_1}$ of a diode assembly and an IGBT.

In some embodiments where the power semiconductor device is a packaged device, the on-state voltage drop $V_{on}$ is the voltage drop across the packaged device in its on-state. For example, the on-state voltage drop $V_{on}$ is measured by using a circuit composed of a voltage clamp, a signal conditioner, and an Analog to Digital Converter (ADC).

In the context of step d), a monitored value representing a state of operation of the power semiconductor device 1 can comprises, for example, a load current $I_{load}$ and/or a modulating frequency $F_{mod}$. In some embodiments, the modulating frequency $F_{mod}$ is thus a useful parameter to receive or estimate, the voltage drop $V_{on}$. Depending on the operational application of the power semiconductor device, some of said devices are used with an alternate current (AC), for example in combination with a motor. In such a case, the load current $I_{load}$ has a periodical shape, for example a sinusoidal behavior. The modulating frequency $F_{mod}$ is variable and, for example, comprised between 1 Hz and 1 kHz. For example, in the case of a device used as a converter connected to a synchronous motor, the modulating frequency is proportional to the rotational speed of the motor. One example is an electrical vehicle. In such an application, the modulating frequency $F_{mod}$ is low when the vehicle drives slowly and high when the car drives fast. The modulating frequency $F_{mod}$ may be derived from the current and voltage values. It may also be provided by an external controller.

The steps a), b), c), e), f) and g) are arranged to be performed at the best moment to obtain relevant measurements of at least a pair of two relevant voltage drops ($V_{on\_1\_calibration}$ and $V_{on\_2\_calibration}$), and ($V_{on\_1\_test}$ and $V_{on\_2\_test}$). The first and second predefined sets of criteria of measuring steps e) and f) are selected accordingly. Preferably, the first and second predefined sets of criteria are selected consistent with each other.

Figure 11:
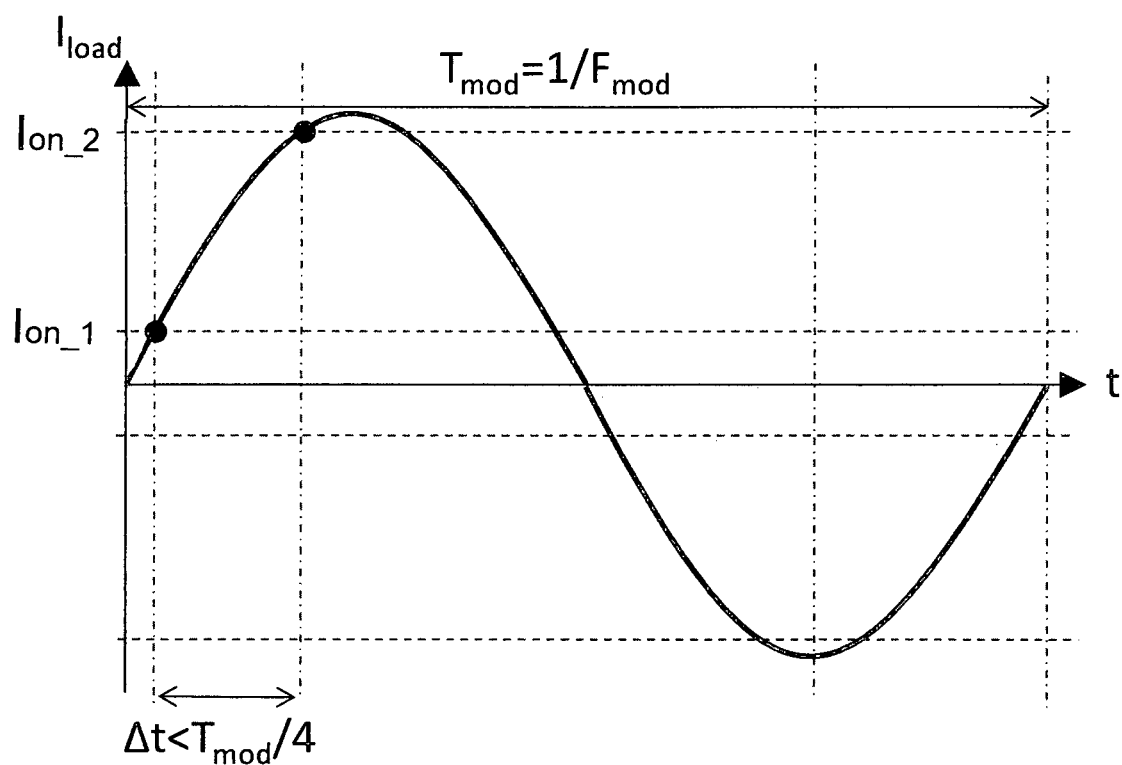
FIG. 11 is an example of the measurement of two values of current.

For example, a best moment can be preferably when the temperature T is substantially the same when the two voltage drops $V_{on\_1}$ and $V_{on\_2}$ are measured. For example, the two voltage drops $V_{on\_1}$ and $V_{on\_2}$ are measured at successive instants. For example, it is possible to select the first and second sets of criteria to improve the two measurements at two instants which are separated of at most 5 milliseconds. For example, the two voltage drops $V_{on\_1}$ and $V_{on\_2}$ are measured in the same quarter of a period of an AC current ($T_{mod}/4$) and for a high modulating frequency $F_{mod}$, for example a modulating frequency superior to Z, where Z is equal to 20, 30 or 50 Hz. FIG. 11 shows an example to measure to distinct voltage drop values $V_{on\_1}$ and $V_{on\_2}$ at two distinct current values $I_{on\_1}$ and $I_{on\_2}$ at two successive instants separated from each other of less than one quarter of a period T.

The at least one monitored value representing a state of operation of the power semiconductor device 1 can comprise the current $I_{on}$ itself to which the power semiconductor device 1 is subjected. In such a case, the sets of criteria can comprise criteria about the said current $I_{on}$ itself. This enables to improve measurements in two distinct situations about the current $I_{on}$, for example under low and high current. For example, the first predefined set of criteria includes a monitored current value I inferior to a first threshold value. The second predefined set of criteria includes a monitored current value I superior to a second threshold value. The second threshold value is for example selected superior to first threshold value. For example the threshold values are defined as a part of a nominal current value $I_{nom}$: the first threshold value is equal to X % of the nominal current value $I_{nom}$ and the second threshold value is equal to Y % of the nominal current value $I_{nom}$. For example, X is equal to 20, 30 or 40%. For example, Y is equal to 60, 70 or 80%. These values can be defined as a function of the nominal current value $I_{nom}$ of the power semiconductor device 1, and also on the type of application and on features of the current sensor (precision and accuracy). In embodiments wherein conditions on the first and the second current values $I_{on\_1}$ and $I_{on\_2}$ are fulfilled (one being strictly superior to the other), the set of criteria of steps e), respectively f), can be the same as the conditions of step a), respectively b).

The at least one monitored value representing a state of operation of the power semiconductor device 1 can comprises the current $I_{on}$ itself to which the power semiconductor device 1 is subjected and a gate level G, of a transistor or of a set of transistors, of the power semiconductor device 1. In such a case, the sets of criteria can be as it follows:
 the first predefined set of criteria includes a low level of the gate level, and
 the second predefined set of criteria includes a high level of the gate level.

It is possible to combine, in a same embodiment, a condition about the different current values $I_{on\_1}$ and $I_{on\_2}$ between the two steps a) and b), with two sets of criteria for steps e) and f) related to state of operation defined with respect to a gate level, an vice versa.

The embodiments including conditions (steps a) and b)) and/or criteria (steps e) and f)) about the gate levels are particularly suitable for MOSFETs with no external antiparallel diodes. The voltage ($V_{on\_1\_calibration}$ and/or $V_{on\_1\_test}$) is measured for a current $I_{on\_1}$ when the MOSFET is ON (high gate level). The voltage ($V_{on\_2\_calibration}$ and/or $V_{on\_2\_test}$) is measured for a current $I_{on\_2}$ when the MOSFET is OFF (low gate level) and the internal body-diode conducts. The current values $I_{on\_1}$ and $I_{on\_2}$ can be equal and negative (flowing from source to drain).

Because it may not be necessary to estimate the state of health very frequently, it may be decided to deactivate the health estimation for a certain operation time for at least some embodiments.

In other embodiments, the measuring of the voltage drop values $V_{on\_1}$ and $V_{on\_2}$ of the power semiconductor device 1 and the measuring of the current values $I_{on\_1}$ and $I_{on\_2}$ to which the power semiconductor device 1 is subjected are implemented continuously or at a predetermined frequency, and not only at a moment during which the at least one monitored value (for example $F_{mod}$, and/or $I_{load}$) corresponds to a first or a second predefined state of operation of the power semiconductor device 1 (when the sets of criteria are respected). In other words, the voltage drops $V_{on}$ and the current $I_{on}$ can be continuously monitored and the operational data $V_{on\_1\_test}$, $I_{on\_1}$, $V_{on\_2\_test}$, $I_{on\_2}$ be defined by post-processed, or the monitoring is triggered when the current are equals to $I_{on\_1}$ and $I_{on\_2}$.

Embodiments including a triggering only when the currents are equal to $I_{on\_1}$ and $I_{on\_2}$ are particularly suitable for bipolar devices, like IGBTs and Diodes, including body-diode MOSFET. Such embodiments are particularly advantageous in combination with measurements under low and high currents $I_{on\_1}$ and $I_{on\_2}$ (see the example above).

The above examples of criteria can be combined one with the others.

In the step h) of calculating a numerical index, the operational data, including the measured voltage $V_{on\_1\_test}$ and $V_{on\_2\_test}$ are used together with the calibration data, $V_{on\_1\_calibration}$, $I_{on\_1}$ and/or $T_{1\_calibration}$, $V_{on\_2\_calibration}$, $I_{on\_2}$ and/or $T_{2\_calibration}$ to estimate an electrical resistance increase $\Delta R$, and optionally a temperature T if calibration data includes data to estimate the temperature in function of the voltage drop $V_{on}$.

In another point of view, the method can be decomposed as follows:
1) Receive or generate calibration data;
2) Receive or measure information on operating conditions;
3) Decide on moment for state of health estimation and/or temperature estimation;
4) Receive or measure a first voltage drop measure $V_{on\_1}$ at current $I_{on\_1}$;
5) Receive or measure a second voltage drop measure $V_{on\_2}$ at current $I_{on\_2}$;
6) Process the data, including:
   a. Estimate the junction temperature using previously estimated $\Delta R$, and/or
   b. Estimate the electrical resistance increase $\Delta R$.

In an example tested by the applicant, a model has been established after the calibration for the temperature T. A convergence leads to the following relation:

$$V_{on}=(0.001+\Delta R)\times I_{on}+[(1-0.004\times T)+0.015\times I_{on}]$$

In such an equation, the first part is a connection resistance (wire-bond) and the second part is a die voltage drop.

In the following, this relation is used to estimate $\Delta R$ and T

1. Objective: T estimation

We consider $\Delta R=0$ because the module is new (not used). $F_{mod}$ does not need to be high, thus $T1 \neq T2$.

It is possible to estimate T1 and T2 using above equations and measured $V_{on\_1\_test}$ and $V_{on\_2\_test}$.

Assuming real temperatures T1real=80° C. and T2real=90° C., if the above equation is correct, the measure of $V_{on\_1\_test}$ and $V_{on\_2\_test}$ allows estimating T1 and T2 accurately
  a. Low current ($I_{on\_1}$=2 A), measured $V_{on\_1\_test}$=0.712V leads to an estimated temperature of 80° C.
  b. High current ($I_{on\_2}$=100 A), measured $V_{on\_2\_test}$=2.24V leads to an estimated temperature of 90° C.

Thus, the equation is correct.

2. Objective; T estimation

The resistance increase of 5 mΩ due to a degradation, but it is unknown (it is assumed that $\Delta R$=0mΩ)

The error due to the bad estimation of $\Delta R$ has impact on the estimation of T2.

$\Delta R$real=5mΩ, T estimation (real=80° C. and 90° C.)
  a. Low current ($I_{on\_1}$=2 A), measured $V_{on}$=0.713V leads to an estimated temperature of 79.75° C. instead of 80° C.
  b. High current ($I_{on\_2}$=100 A), measured $V_{on}$=2.29V leads to an estimated temperature of 77.5° C. instead of 90° C.

Thus, the value of $\Delta R$ has to be updated.

3. Objective; $\Delta R$ estimation at high $F_{mod}$ $\Delta R$real=5 mΩ, $\Delta R$ estimation (real=80° C.)
  a. Low current ($I_{on\_1}$=2 A), measured $V_{on}$=0.713V leads to an estimated temperature of 79.75° C. instead of 80° C. Here, we estimate the temperature only b. High current ($I_{on\_2}$=100 A), measured $V_{on}$=2.33V (at real 80° C. because high $F_{mod}$) leads to an estimated $\Delta R$ of 4.9mΩ (with 79.75° C. according to the model). Here, the $\Delta R$ is estimated.

After $\Delta R$ estimation, it is used again to estimate the temperature, and the damage, leading to the convergence of both T and $\Delta R$ measurements.

In the following, some examples of embodiments are described in function of various types/configurations of power semiconductor devices.

Figure 9:
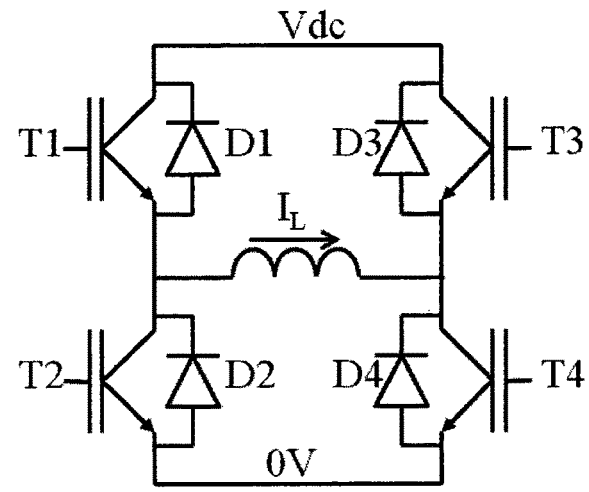
FIG. 9 is a full bridge configuration consisting of two half-bridge legs.

In a first example, the power semiconductor device 1 has a half-bridge configuration. FIG. 9 shows, for example, a full-bridge configuration consisting of two half-bridge legs. A diode is connected in anti-parallel to IGBTs. The voltage is sensed across the combination. The current in the load is sensed. Depending on the load current, the measured voltage drop is the one across the IGBT (positive voltage) or across the diode (negative voltage). The monitoring of each device is performed, for example, during following half modulating periods.

In a second example, the power semiconductor device 1 is used as a gate voltage sensitivity. For some IGBTs and MOSFETs, the temperature sensitivity of the $V_{on}(I_{on})$ curves depends on the gate voltage. This modifies the curves $V_{on\_2}(V_{on\_1})$ and $V_{on}(T_j)$ as shown on FIGS. 4-8. The gate voltage can thus be controlled to increase the sensitivity for both the method which estimates $\Delta R$ only and the method which estimates $\Delta R$ and $T_j$. This involves a special means to control the gate voltage. In such a case, the model correlating $V_{on\_1}$ to $V_{on\_2}$ and ($\Delta R$ or $V_{on}$) to ($T_j$, $I_{on}$ and $\Delta R$) needs to be established with the proper gate voltage.

In a third example, the method is used to estimate a state of health of the power semiconductor device 1. The increase of electrical resistance $\Delta R$ may be directly used to estimate the state of health. For example, an increase of 1mΩ may indicate a damage level of 50%. Detail pre-calibration data.

In a fourth example, the method is used to estimate a state of health of the power semiconductor device 1 by using a stress counting. The junction temperature estimated on-line may be used as an input to a temperature cycle counting algorithms such as "rainflow" algorithm. A so-called damage model such as Coffin-Manson model or a combined Coffin-Manson and Arrhenius model can be used to estimate the damage created by each cycle. Then using a damage accumulation law such as a linear accumulation law, the total damage can be estimated.

In a fifth example, the method is used to estimate a state of health of the power semiconductor device 1 by using the thermal resistance parameter. The power losses $P_{loss}$ in a die may be estimated with a loss model with inputs $I_{on}$, $V_{on}$. The temperature difference $\Delta T$ between the die and the baseplate can be estimated using $T_j$ estimation and the case temperature $T_c$. The thermal resistance $R_{th}$ can be estimated using $P_{loss}$ and $\Delta T = T_j - T_c$.

In a sixth example, including the optional step i), the method is used to estimate an end of life (or a Remaining Useful Life, RUL) of the power semiconductor device 1. This requires an extrapolation in time of a parameter. This parameter may be the state of health, and/or the electrical resistance increase $\Delta R$ and/or the thermal resistance increase. A model of the evolution of these parameters may be required to perform the extrapolation. One physically inspired example of model is:

$$\Delta R = a + bt + \frac{c}{1-dt}$$

It is a simplified model that assumes a linear increase of the resistivity of the metallization and a linear crack propagation in wire-bonds. Such a model can be identified/fitted and then extrapolated. The crossing point with a threshold value provides the end of life.

The preceding examples can be combined one with the others and with the embodiments described above. The method to establish a degradation state of electrical connections in a power semiconductor device 1 and of its health can be applied various power modules in various technical fields, especially in a traction equipment, wind energy, factory automation, or automotive.

The invention has been described as a method. In another aspect, the invention can also be view as a diagnostic device 100 (shown of FIG. 10) including at least one processor operatively associated with at least one storage medium, and a set of plugs able to be plugged to the power semiconductor device 1. Such a diagnostic device 100 is arranged in order to implement a method according the preceding when plugged to the power semiconductor device 1. The invention can also have a form of a kit, for example comprising power semiconductor device 1 and a diagnostic device 100 able to be operatively coupled one with the other to form an operational assembly.

The invention is not limited to the devices, assemblies, kits and process described here, which are only examples. The invention encompasses every alternative that a person skilled in the art would envisage in the scope of the following claims.

The invention claimed is:

1. Method to establish a degradation state of electrical connections in a power semiconductor device, the method comprising:
    a) measuring at least a first voltage drop value of said power semiconductor device when said power semiconductor device is in a first state, subjected to a first current value and to a first temperature value;
    b) measuring at least a second voltage drop value of said power semiconductor device when said power semiconductor device is in a second state, subjected to a second current value and to a second temperature value, the second temperature value being equal to the first temperature value within plus or minus 5° C., at least one of the two following conditions being fulfilled:
        the first current values being equal to a first threshold value and the second current value being equal to a second threshold value, the second threshold value being strictly superior to the first threshold value,
        the first state and the second state are different one from the other at least with respect to a gate level of a transistor, or of a set of transistors, of the power semiconductor device;
    c) saving the at least two values as calibration data;
    d) monitoring in operational conditions the current and at least one parameter representing a state of operation of said power semiconductor device;
    e) measuring at least a third voltage drop value of said power semiconductor device
        under current equal to the first current value within plus or minus 5% of a nominal current of the power semiconductor device, and
        at a moment during which the at least one monitored parameter corresponds to a first predefined set of criteria related to a state of operation of said power semiconductor device and to a third temperature value of the power semiconductor device;
    f) measuring at least a fourth voltage drop value of said power semiconductor device
        under current equal to the second current value within plus or minus 5% of the nominal current of the power semiconductor device, and
        at a moment during which the at least one monitored parameter corresponds to a second predefined set of criteria related to a state of operation of said power semiconductor device and to a fourth temperature value of the power semiconductor device equal to the third temperature value within plus or minus 5° C.;
    g) saving the at least two values as operational data;
    h) calculating a numerical index in function of the calibration data and the operational data in a manner to estimate a degradation state of said power semiconductor device.

2. Method according to claim 1, wherein said power semiconductor device comprises an Insulated Gate Bipolar Transistor (IGBT), a Metal Oxide Semiconductor Field Effect Transistor (MOSFET), a diodes assembly, or a combination of such elements.

3. Method according to claim 1, wherein the measuring of the voltage drop values of said power semiconductor device are implemented continuously or at a predetermined frequency, and not only at a moment during which the at least one monitored parameter corresponds to a predefined state of operation of said power semiconductor device.

4. Method according to claim 1, wherein the second threshold value is superior or equal to twice the first threshold value.

5. Method according to claim 1, wherein the numerical index is calculated by extrapolation from the hypothesis that both the calibration data correspond to a situation wherein the numerical index has a value corresponding to a total absence of degradation of the electrical connections of said power semiconductor device.

6. Method according to claim 1, wherein the monitoring step includes the monitoring of at least a frequency of said current.

7. Method according to claim 6, wherein the first and second predefined set of criteria includes a frequency superior or equal to 20 Hz, and the measuring of the at least third and fourth voltage drop value are made in two respective instants of a common period of the current.

8. Method according to claim 1, wherein the monitored parameter corresponds to a state of the power semiconductor device with respect to a gate level of a transistor, or of a set of transistors, of said power semiconductor device, the first and second predefined set of criteria including a different criteria one with respect to the other about the state of the power semiconductor device with respect to said gate level.

9. Method according to claim 1, wherein
    the measuring steps a) and b) of the said first and second voltage drop values are made in two respective instants mutually separated of at most 50 milliseconds; and/or
    the measuring steps e) and f) of the said third and fourth voltage drop values are made in two respective instants mutually separated of at most 50 milliseconds.

10. Method according to claim 1, wherein the measuring step of at least the first voltage drop value, further includes measuring the first temperature value, and/or
    wherein the measuring step of at least the second voltage drop value, further includes measuring the second temperature value;
    wherein the saving step further includes saving each said temperature value associated with the respective voltage drop value as calibration data, and wherein the calculating step of a numerical index further includes calculating a temperature in function of the calibration data and the respective operational data.

11. Method according to claim 1, wherein the said at least one parameter representing a state of operation of said power semiconductor device monitored during the monitoring step is deprived of a measured temperature; the operational data being deprived from measured temperature values to the step of calculating said numerical index.

12. Method according to claim 1, further comprising a step of constructing a model of a relation between the at least two voltage drops in function of the current values when the numerical index is equal to zero, said model being then used to calculate said numerical index in function of the calibration data and the operational data.

13. Method according to claim 1, further including the following step:
   i) constructing a degradation model of said power semiconductor device by extrapolation of an evolution of the numerical index in such a way to estimate an end of life of the electronic device.

14. A diagnostic device including at least one processor operatively associated with at least one storage medium, and a set of plugs able to be plugged to a power semiconductor device, the diagnostic device being arranged in order to implement a method according to claim 1 when plugged to said power semiconductor device.

15. A non-transitory computer-readable storage medium comprising a program product stored thereon and executable by a processor in the form of a software agent including at least one software module comprising instructions to implement a method according to claim 1.

* * * * *